(12) United States Patent
Li

(10) Patent No.: US 10,297,511 B2
(45) Date of Patent: May 21, 2019

(54) FIN-FET DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 5 days.

(21) Appl. No.: 15/785,071

(22) Filed: Oct. 16, 2017

(65) Prior Publication Data
US 2018/0108575 A1    Apr. 19, 2018

(30) Foreign Application Priority Data

Oct. 19, 2016  (CN) .......................... 2016 1 0911374

(51) Int. Cl.
| | |
|---|---|
| *H01L 21/8238* | (2006.01) |
| *H01L 21/768* | (2006.01) |
| *H01L 27/092* | (2006.01) |
| *H01L 29/66* | (2006.01) |
| *H01L 29/417* | (2006.01) |

(Continued)

(52) U.S. Cl.
CPC ................ *H01L 21/823871* (2013.01); *H01L 21/76897* (2013.01); *H01L 21/823814* (2013.01);

(Continued)

(58) Field of Classification Search
CPC ....... H01L 21/823871; H01L 21/76897; H01L 21/823814; H01L 21/823821;

(Continued)

(56) References Cited

U.S. PATENT DOCUMENTS 8,624,324 B1 *  1/2014  Chen ................. H01L 21/76895
                                                     257/288
9,496,283 B1 * 11/2016  Zhang ................. H01L 27/1211
                        (Continued)

FOREIGN PATENT DOCUMENTS

EP           2722893 A1    4/2014

OTHER PUBLICATIONS

The European Patent Office (EPO) The Extended European Search Report for 17196527.0 Mar. 20, 2018 10 Pages.

*Primary Examiner* — Shahed Ahmed
(74) *Attorney, Agent, or Firm* — Anova Law Group, PLLC

(57) ABSTRACT

A method for fabricating a Fin-FET device includes forming fin structures on a substrate and an isolation structure to cover a portion of sidewall surfaces of the fin structures, forming gate structures to cover a portion of sidewall and top surfaces of the fin structures, forming doped source/drain regions in the fin structures, forming a metal layer on the doped source/drain regions and the gate structures, performing a reaction annealing process to convert the metal layer formed on the doped source/drain regions into a metal contact layer and then removing the unreacted metal layer, forming a dielectric layer on the metal contact layer and the gate structures with a top surface higher than the top surfaces of the gate structures, forming a plurality of vias through the dielectric layer above the metal contact layer, and forming a plurality of conductive plugs by filling the vias.

20 Claims, 7 Drawing Sheets

(51) Int. Cl.
*H01L 29/78* (2006.01)
(52) U.S. Cl.
CPC ............ *H01L 21/823821* (2013.01); *H01L 21/823864* (2013.01); *H01L 21/823878* (2013.01); *H01L 27/0924* (2013.01); *H01L 29/41791* (2013.01); *H01L 29/66545* (2013.01); *H01L 29/66795* (2013.01); *H01L 29/785* (2013.01)
(58) Field of Classification Search
CPC ..... H01L 21/823878; H01L 21/823864; H01L 27/0924; H01L 29/41791; H01L 29/66545; H01L 29/66795; H01L 29/785; H01L 21/28052; H01L 21/32051; H01L 21/823418
See application file for complete search history.

(56) References Cited

U.S. PATENT DOCUMENTS

| | | |
|---|---|---|
| 2005/0051825 A1 | 3/2005 | Fujiwara et al. |
| 2007/0231984 A1 | 10/2007 | Metz et al. |
| 2013/0134506 A1 | 5/2013 | Yagishita |
| 2013/0288456 A1 | 10/2013 | Lai et al. |
| 2013/0341639 A1 | 12/2013 | Toh et al. |
| 2014/0203370 A1 | 7/2014 | Maeda et al. |
| 2015/0255473 A1* | 9/2015 | Hong .................. H01L 21/0276 257/316 |
| 2016/0020301 A1* | 1/2016 | Park .................. H01L 29/66636 257/283 |
| 2016/0093741 A1 | 3/2016 | Yang et al. |
| 2016/0211338 A1* | 7/2016 | Wang ................ H01L 21/82348 |

* cited by examiner

US 10,297,511 B2

FIN-FET DEVICE AND FABRICATION METHOD THEREOF

CROSS-REFERENCES TO RELATED APPLICATIONS

This application claims the priority of Chinese Patent Application No. CN201610911374.8, filed on Oct. 19, 2016, the entire content of which is incorporated herein by reference.

FIELD OF THE DISCLOSURE

The present disclosure generally relates to the field of semiconductor fabrication technology and, more particularly, relates to Fin-FET devices and fabrication methods thereof.

BACKGROUND

With continuous increase of the integration degree of semiconductor devices, the critical dimension of semiconductor devices decreases continuously. However, problems arise. For example, the surface resistance and the contact resistance in the source/drain regions of the devices may increase, and thus the response speed of the devices may decrease and the signals may be delayed. Therefore, interconnection structure with a low resistance becomes a key factor for fabricating highly integrated semiconductor devices.

To reduce the contact resistance in the source/drain regions of the devices, a metal silicide fabrication method may be introduced. The metal silicide may have a relatively low resistivity, and thus the contact resistance at the source/drain electrodes may be significantly reduced. Specifically, metal silicide, self-aligned metal silicide, as well as the corresponding formation processes have been widely used to reduce the surface resistance and the contact resistance of the source electrodes and the drain electrodes, and thus may reduce the resistance-capacitation delay (RC delay).

According to existing self-aligned metal silicide technology, $SiNi_x$ is usually used to form the metal silicide. Specifically, the metal silicide formed using the $SiNi_x$ may demonstrate advanced properties including low contact resistance, low silicon consumption, etc. and may also be able to easily reach a relatively narrow line width. Therefore, $SiNi_x$ is regarded as an ideal metal silicide.

As semiconductor devices are developed to switch from planar devices to fin field-effect transistor (Fin-FET) devices, the contact resistance in Fin-FET devices formed by existing metal silicide methods may not meet the device performance requirements. Therefore, new methods for fabricating Fin-FET devices are highly demanded to reduce the contact resistance in the formed Fin-FET devices, and thus improve the operation speed of the Fin-FET devices. The disclosed Fin-FET devices and fabrication methods thereof are directed to solve one or more problems set forth above and other problems in the art.

BRIEF SUMMARY OF THE DISCLOSURE

One aspect of the present disclosure includes a method for fabricating a Fin-FET device. The method includes forming a plurality of fin structures on a substrate, forming an isolation structure on the substrate to cover a portion of sidewall surfaces of the fin structures, forming a plurality of gate structures on the isolation layer across the fin structures and covering a portion of sidewall and top surfaces of the fin structures, forming doped source/drain regions in the fin structures on two opposite sides of each gate structure, forming a metal layer on top surfaces of the doped source/drain regions and the gate structures, and performing a reaction annealing process on the metal layer to convert the portion of the metal layer formed on the doped source/drain regions into a metal contact layer. The fabrication method further includes removing the unreacted portion of the metal layer after the reaction annealing process, forming a dielectric layer on the metal contact layer and the gate structures with a top surface higher than the top surfaces of the gate structures, forming a plurality of vias through the dielectric layer to expose a portion of the metal contact layer, and forming a plurality of conductive plugs by filling up the vias.

Another aspect of the present disclosure provides a Fin-FET device. The Fin-FET device includes a substrate, a plurality of fin structures protruding from the substrate, an isolation structure covering a portion of sidewall surfaces of the fin structures with a top surface of the isolation structure lower than top surfaces of the fin structures, and a plurality of gate structures formed on the isolation layer across the fin structures. The gate structures cover a portion of the sidewall and the top surfaces of the fin structures. The Fin-FET device also includes a plurality of doped source/drain regions formed in the fin structures on two opposite sides of each gate structure, a metal contact layer formed on entire surfaces of the doped source/drain regions and converted from a metal layer through a reaction annealing process, a dielectric layer formed on the metal contact layer and the gate structures with a top surface higher than the top surfaces of the gate structures, and a plurality of conductive plugs formed through the dielectric layer and in contact with a portion of the metal contact layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Contact resistance in conventional Fin-FET devices may be very large and the operation speed may also need to be improved. In the following, an example will be provided to illustrate the problems in the Fin-FET devices.

Figure 1:
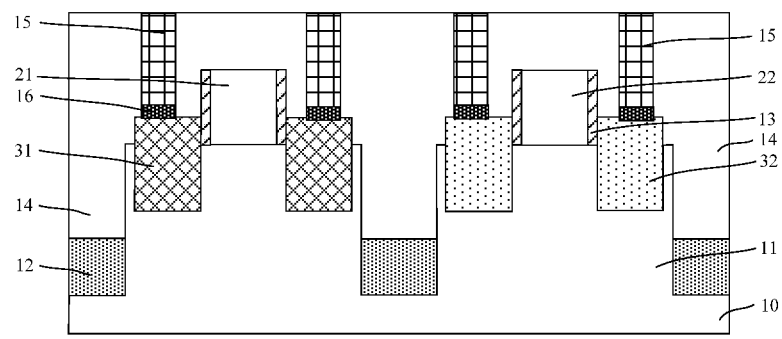
FIG. 1 illustrates a schematic cross-section view of a Fin-FET device.

FIG. 1 shows a schematic cross-section view of a conventional Fin-FET device. The Fin-FET device includes two complementary metal-oxide-semiconductor (CMOS) transistors. The fabrication process for the Fin-FET device includes the following steps.

First, a substrate 10 is provided and two fin structures 11 are formed on the substrate 10. Specifically, the fin structures 11 protrude from the substrate 10. Moreover, an isolation structure 12 is formed on the substrate and the isolation structure 12 covers a portion of the top surfaces of the fin structures 11.

The substrate 10 includes a P-type metal-oxide-semiconductor (PMOS) region and an N-type metal oxide-semiconductor (NMOS) region, and each of the PMOS region and the NMOS region includes one fin structure 11.

Further, a first gate structure 21 is formed on the isolation structure 12 across the fin structure 11 in the PMOS region and a second gate structure 22 is formed on the isolation structure 12 across the fin structure 11 in the NMOS region. A sidewall spacer 13 is then formed on each sidewall surface of the first gate structure 21 and the second gate structure 22.

Then, first doped source/drain regions 31 are formed in the fin structure 11 in the PMOS region on the two opposite sides of the first gate structure 21 and second doped to source/drain regions 32 are formed in the fin structure 11 in the NMOS region on the two opposite sides of the second gate structure 22.

Further, a dielectric layer 14 is formed on the first doped source/drain regions 31, the second doped source/drain regions 32, the isolation structure 12, the first gate structure 21, and the second gate structure 22. The top surface of the dielectric layer 14 is higher than the top surface of the first gate structure 21.

Moreover, four vias are formed in the dielectric layer 14 to expose the first doped source/drain regions 31 or the second doped source/drain regions 32. Specifically, each via exposes a portion of the surface of a corresponding first doped source/drain region 31 or a corresponding second doped source/drain region 32.

Further, a metal contact layer 16 is formed on the exposed portion of the surfaces of the first doped source/drain regions 31 and the second doped source/drain regions 32 on the bottom of the vias. Then, a conductive plug 15 is formed on the metal contact layer 16 to fill up each of the four vias.

According to the fabrication method described above, in order to avoid exposing the first gate structure 21 or the second gate structure 22 during the etching process to form the vias, the formed vias usually has a relatively narrow width. Thus, a portion of the surfaces of the first doped source/drain regions 31 and a portion of the surfaces of the second doped source/drain regions 32 are exposed on the bottom of the vias. As such, the metal contact layer 16 may only be formed on a portion of the surfaces of the first doped source/drain regions 31 and a portion of the surfaces of the second doped source/drain regions 32. Therefore, the effect of the metal contact layer 16 to reduce the contact resistance of the Fin-FET device may be limited.

Figure 16:
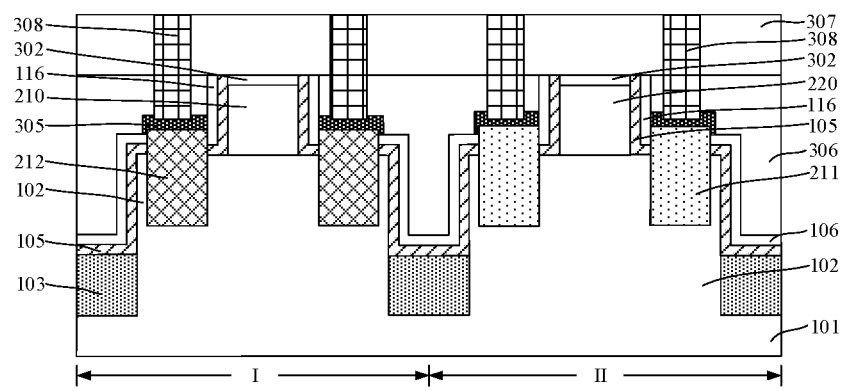
Figure 17:
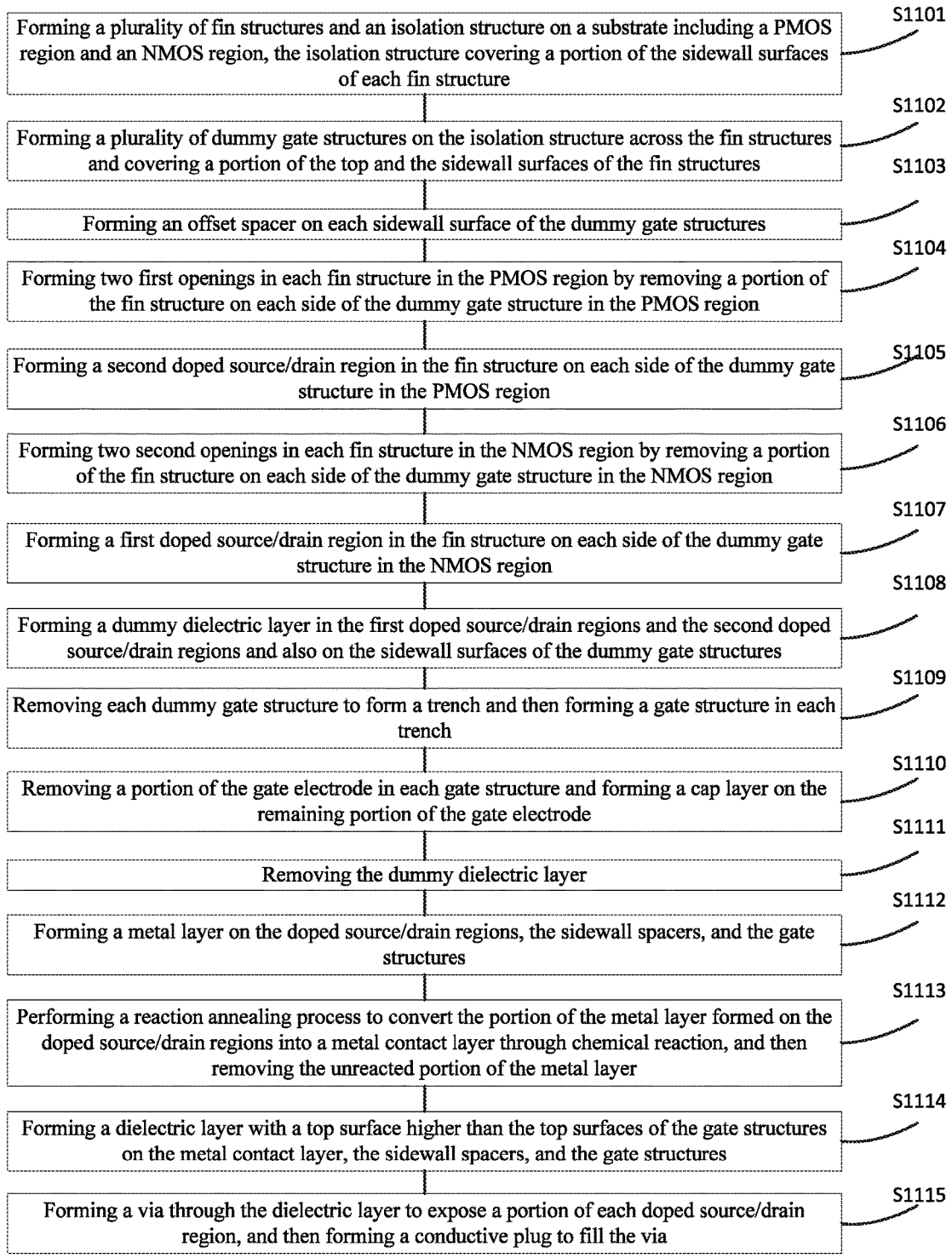
FIG. 17 illustrates a flowchart of an exemplary method for fabricating a Fin-FET device consistent with various disclosed embodiments in the present disclosure.

The present disclosure provides a method for fabricating Fin-FET devices. FIG. 17 shows a flowchart of an exemplary method for fabricating a Fin-FET device consistent with various disclosed embodiments in the present disclosure. FIGS. 2-16 show schematic cross-section views of semiconductor structures at certain stages of the exemplary method for fabricating the Fin-FET device.

Figure 2:
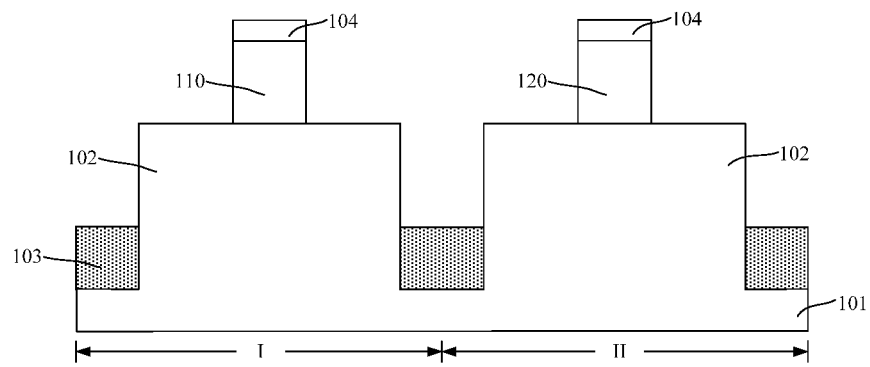
FIGS. 2-16 illustrate schematic cross-section views of semiconductor structures at certain stages of an exemplary method for fabricating a Fin-FET device consistent with various disclosed embodiments in the present disclosure.

Referring to FIG. 17, at the beginning of the fabrication process, a plurality of fin structures may be formed on a substrate and an isolation structure may be formed on the substrate to cover a portion of the sidewall surfaces of each fin structure (S1101). FIG. 2 shows a schematic cross-section view of a corresponding semiconductor structure.

Referring to FIG. 2, a plurality of fin structures 102 are formed on a substrate 101. An isolation structure 103 may also be formed on the substrate 101 to cover a portion of the sidewall surfaces of each fin structure 102.

For illustration purpose, the Fin-FET device to be formed is described to be a CMOS device, and the substrate 101 may include an NMOS region I and a PMOS region. In addition, the NMOS region I may provide a process platform for forming an NMOS transistor and the PMOS region II may provide a process platform for forming a PMOS transistor. In other embodiments, the substrate may only include PMOS region(s) or may only include NMOS region(s). Accordingly, the Fin-FET device to be formed may only include PMOS transistor(s) or may only include NMOS transistor(s).

The substrate 101 may be made of silicon, germanium, SiGe, SiC, GaAs, InAs, or any other appropriate semiconductor material. The substrate 101 may also be made of silicon on insulator (SOI), germanium on insulator (GOI), or any other semiconductor structure. The plurality of fin structures 102 may be made of silicon, germanium, SiGe, SiC, GaAs, InAs, or any other appropriate semiconductor material. In one embodiment, the substrate 101 is made of silicon and the plurality of fin structures 102 are also made of silicon.

In one embodiment, the substrate 101 and the plurality of fin structures 102 may be formed by a process including the following steps. First, an initial substrate may be provided. A patterned layer may then be formed on the surface of the initial substrate. Further, the initial substrate may be etched using the patterned layer as an etch mask to form the substrate 101 and the plurality of fin structures 102 protruding from the surface of the substrate 101.

The isolation structure 103 formed on the substrate 101 may be used to electrically isolate neighboring fin structures 102. The isolation structure 103 may be made of an insulating material such as $SiO_x$, $SiN_x$, SiON, SiCON, etc. In one embodiment, the isolation structure 103 is made of $SiO_x$.

Further, returning to FIG. 17, a plurality of dummy gate structures may be formed on the isolation structure across the plurality of fin structures to cover a portion of the top and the sidewall surfaces of each fin structure (S1102).

Referring to FIG. 2, a plurality of dummy gate structures may be formed on the isolation structure 103 across the plurality of fin structures 102. The plurality of dummy gate structures may cover a portion of the top and the sidewall surfaces of each fin structure 102.

In one embodiment, the substrate 101 may include an NMOS region I used to form a plurality of NMOS transistors and a PMOS region II used to form a plurality of PMOS transistors. Accordingly, the plurality of dummy gate structures may be formed by a process including forming first dummy gate structures 110 on the isolation structure 103 in the NMOS region I and across the fin structures 102 in the NMOS region I and forming second dummy gate structures 120 on the isolation structure 103 in the PMOS region II and across the fin structures 102 in the PMOS region II. For illustration purpose, although a plurality of first dummy gate structures and a plurality of second dummy gate structures may be formed on the substrate 101, only one first dummy gate structure 110 in the NMOS region I and one second dummy gate structure 120 in the PMOS region II are shown in FIG. 2. Moreover, the formed dummy gate structures include both the plurality of first dummy gate structures 110 and the plurality of second dummy gate structures 120.

In a subsequent process, the first dummy gate structure 110 may be removed and a first gate structure may then be formed at the position of the first dummy gate structure 110. Similarly, the second dummy gate structure 120 may be removed and a second gate structure may then be formed at the position of the second dummy gate structure 120. The first dummy gate structure 110 may have a single-layer structure or a multiple-layer structure. The first dummy gate structure 110 may include a dummy gate electrode layer, or may include a dummy oxide layer and a dummy gate electrode formed on the dummy oxide layer. Moreover, the dummy gate electrode may be made of polycrystalline silicon or amorphous carbon, and the dummy oxide layer may be made of $SiO_x$ or SiON.

In one embodiment, the first dummy gate structures 110 and the second dummy gate structures 120 may be formed by a process including the following steps. First, a dummy gate film may be formed on the surface of the isolation structure 103. The dummy gate film may be formed across the plurality of fin structures 102 and covering the top and the sidewall surfaces of the plurality of fin structures 102. A hard mask layer 104 may be formed on the surface of the dummy gate film. The hard mask layer 104 may be made of $SiN_x$, SiON, SiC, BN, etc. The hard mask layer 104 may define the pattern of the subsequently-formed first dummy gate structures 110 and the pattern of the subsequently-formed second dummy gate structures 120. Then, by patterning the dummy gate film using the hard mask layer 104 as a mask, the plurality of first dummy gate structures 110 may be formed on the portion of the isolation structure 103 in the NMOS region I and the plurality of second dummy gate structures 120 may be formed on the portion of the isolation structure 103 in the PMOS region II.

In one embodiment, the portion of the hard mask layer 104 formed on the top surfaces of the first dummy gate structures 110 and the second dummy gate structures 120 may be retained after the patterning process. As such, the remaining portion of the hard mask layer 104 may provide protection for the top of the first dummy gate structures 110 and the top of the second dummy gate structures 120 during subsequent fabrication processes, preventing the top of the first dummy gate structures 110 and/or the top of the second dummy gate structures 120 from declining. Therefore, the top of the subsequently-formed first gate structures and the top of the subsequently-formed second gate structures may be ensured to meet desired process requirements.

Figure 3:
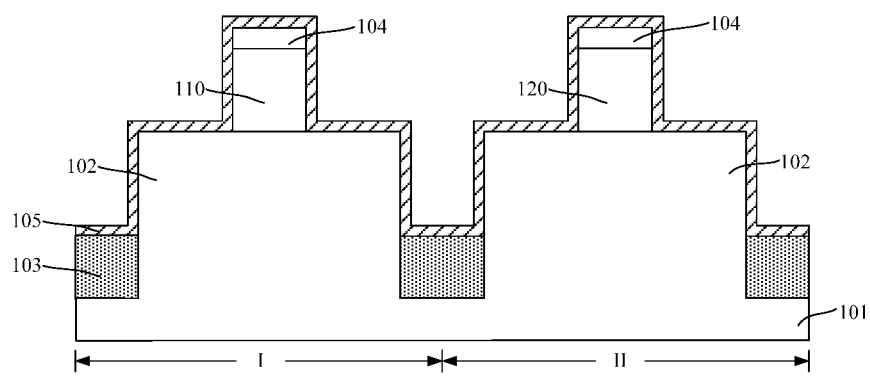

Further, returning to FIG. 17, an offset spacer may be formed on each sidewall surface of the dummy gate structures (S1103). FIG. 3 shows a schematic cross-section view of a corresponding semiconductor structure.

Referring to FIG. 3, an offset spacer 105 may be formed on each sidewall surface of the dummy gate structures. After forming a plurality of first gate structures and a plurality of second gate structures in subsequent processes, the offset spacer 105 may be situated on the sidewall surfaces of the first gate structures and the second gate structures.

In one embodiment, the offset spacer 105 may be formed on the sidewall surfaces of the first dummy gate structures 110 and the second dummy gate structures 120. In a subsequent process, a portion of the fin structures 102 in the NMOS region I on the two opposite sides of each first dummy gate structure 110 as well as a portion of the fin structures 102 in the PMOS region II on the two opposite sides of each second dummy gate structure 120 may be removed by etching. Therefore, in order to reduce process cost and also simplify the process steps, in addition to forming the offset spacers 105 on the sidewall surfaces of the dummy gate structures, the offset spacer 105 may also be formed on the sidewall surfaces of the fin structures 102, the top surfaces of the dummy gate structures, and the top surface of the isolation structure 103. That is, the offset spacers 105 may be formed on the top and the sidewall surfaces of the fin structures 102, the surface of the isolation structure 103, the top and the sidewall surfaces of the first dummy gate structures 110, as well as the top and the sidewall surfaces of the second dummy gate structures 120.

Moreover, the offset spacer 105 may be formed through chemical vapor deposition (CVD), physical vapor deposition (PVD), or atomic layer deposition (ALD). The offset spacer 105 may be made of $SiO_x$, $SiN_x$, or SiON.

In one embodiment, the offset spacer 105 is formed by CVD and made of $SiN_x$. Moreover, the thickness of the formed offset spacer 105 may be in a range of approximately 2 nm to 3 nm.

In other embodiments, the offset spacer may only cover the sidewall surfaces of the first dummy gate structures and the second dummy gate structures. Accordingly, the process to form the offset spacer may include the following steps. First, an offset spacing film may be formed to cover the top and the sidewall surfaces of the dummy gate structures and the surface of the isolation structure. Then, a maskless back etching process may be performed on the offset spacing film to remove the portion of the offset spacing film formed on the top surfaces of the dummy gate structures and on the surface of the isolation structure. As such, the offset spacer covering the sidewall surface of the first dummy gate structure and the sidewall surface of the second dummy gate structure may be formed. In addition, the formed offset spacer may also cover the sidewall surfaces of the fin structures.

Further, after forming the offset spacer 105, the fabrication process may further include performing a first light doping process on the portion of the fin structure 102 on the two opposite sides of each first dummy gate structure 110 in the NMOS region. As such, a first lightly-doped source/drain region (not shown) may be formed in the fin structure 102 on each side of the offset spacer 105 in the NMOS region. Moreover, the type of the doping ions used in the first light doping process may be N-type ions. The fabrication process may also include performing a second light doping process on the portion of the fin structure 102 on the two opposite sides of each second dummy gate structure 120 in the PMOS region. Therefore, a second lightly-doped source/drain region may be formed in the fin structure 102 on each side of the offset spacer 105 in the PMOS region. Moreover, the type of the doping ions used in the second light doping process may be P-type ions. Further, an annealing process may be performed on the plurality of fin structures 102.

The first lightly-doped source/drain region may be used as a lightly-doped drain (LDD) structure of the NMOS region I while the second lightly-doped source/drain region may be used as a LDD of the PMOS region II.

In other embodiments, when forming LDD structure in the Fin-FET device is not required, forming the offset spacer may not be necessary. Accordingly, the sidewall spacer subsequently formed on the sidewall surfaces of the gate structures may have a single-layer structure.

Figure 4:
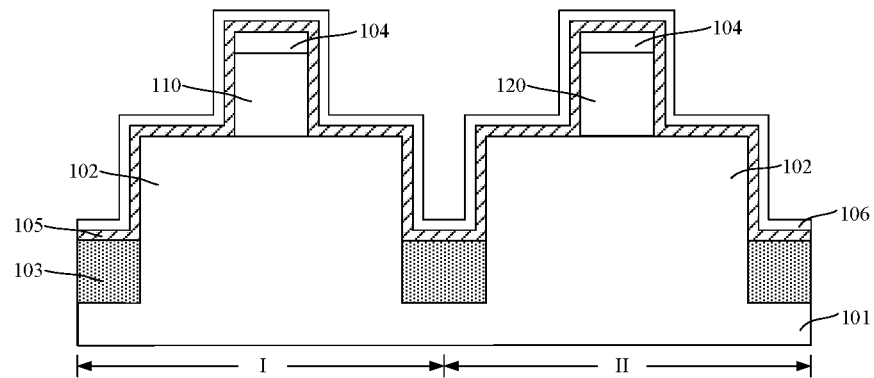

Further, returning to FIG. 17, a mask layer may be formed on the isolation structure, the offset spacer, as well as the top surfaces of the dummy gate structures. FIG. 4 shows a schematic cross-section view of a corresponding semiconductor structure.

Referring to FIG. 4, a mask layer 106 may be formed on the isolation structure, the offset spacer, and the top surfaces of the dummy gate structures. In one embodiment, the mask layer 106 may cover the surface of the offset spacer 105. In other embodiments, when the offset spacer only covers the sidewall surfaces of the first dummy gate structures and the second dummy gate structures, the mask layer may cover the surface of the fin structures, the surface of isolation structure, the top surfaces of the dummy gate structures, as well as the surface of the offset spacer.

The use of the mask layer 106 may include several aspects. First, during a subsequent process to etch a portion of the fin structure 102 formed in the NMOS region I, the mask layer 106 may be used as an etch mask to ensure a certain distance between a subsequently-formed first opening and the previously-formed first lightly-doped source/drain region, and thus avoid complete removal of the first lightly-doped source/drain region. Further, in a subsequent process, the portion of the mask layer 106 formed in the NMOS region I may be etched to form a mask sidewall on each sidewall surface of the fin structure 102 in the NMOS region I. The mask sidewalls may further be used as a mask to form first doped source/drain regions on the two opposite sides of the fin structure 102 in the NMOS region I. Moreover, during a subsequent process to etch a portion of the fin structure 102 formed in the PMOS region II, the mask layer 106 may be used as an etch mask to ensure a certain distance between a subsequently-formed second opening and the previously-formed second lightly-doped source/drain region, and thus avoid complete removal of the second lightly-doped source/drain region. In addition, in a subsequent process, the portion of the mask layer 106 formed in the PMOS region II may be etched to form a mask sidewall on each sidewall surface of the fin structure 102 in the PMOS region II. The mask sidewalls may further be used as a mask to form second doped source/drain regions on the two opposite sides of the fin structure 102 in the PMOS region II.

In addition, the portion of the mask layer 106 formed on the sidewall surface as well as a portion of the top surface of each fin structure 102 may serve as a silicide block layer during a subsequent annealing process to prevent a subsequently-formed metal layer from reacting with the portion of the fin structure 102 not supposed to have a metal contact layer formed on.

The mask layer 106 and the fin structures 102 may be made of different materials. The mask layer 106 may be made of $SiO_x$, $SiN_x$, SiON, etc. Because the mask layer 106 may be used as the etch mask in a subsequent process to etch the fin structures 102, in order to ensure the subsequently-formed mask sidewalls provide sufficient protection for the first gate structures and the second gate structures, the mask layer 106 may be made of a material including $SiN_x$ due to the advantage of high density that $SiN_x$ demonstrates. The mask layer 106 may have a single $SiN_x$ layer structure or have a multi-layer structure including at least one $SiN_x$ layer. For example, the mask layer 106 may have an oxide-nitride-oxide (ONO) structure.

In one embodiment, the mask layer 106 is made of $SiN_x$, and the thickness of the mask layer 106 may be in a range of approximately 3 nm to 6 nm.

Figure 5:
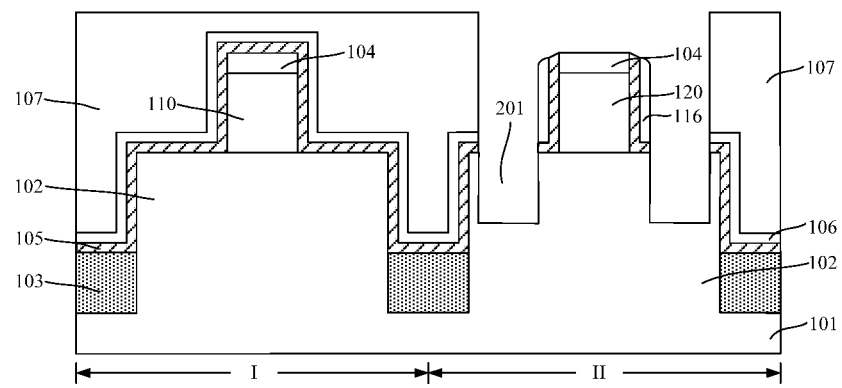

Further, returning to FIG. 17, two first openings may be formed in each fin structure in the PMOS region by removing a portion of the fin structure on each side of the dummy gate structure in the PMOS region (S1104). FIG. 5 shows a schematic cross-section view of a corresponding semiconductor structure.

Referring to FIG. 5, two first openings 201 may be formed in the fin structure 102 in the PMOS region II by removing a portion of the fin structure 102 on each side of the second dummy gate structure 120 in the PMOS region.

In one embodiment, prior to forming the first openings 201, the portion of the mask layer 106 formed in the PMOS region II may be etched to form a mask sidewall 116 to cover a sidewall surface of the corresponding offset spacer 105 in the PMOS region II. The thickness of the mask sidewall 116 may be in a range of approximately 3 nm to 6 nm.

After forming the first openings 201 by etching the fin structure 102, the mask layer 106 formed on a portion of the top and the sidewall surfaces of the fin structure 102 in the PMOS region II may be retained. The remaining portion of the mask layer 106 may prevent undesired epitaxial growth during a subsequent process to form a first stress layer. In addition, during a subsequent reactive annealing process, the remaining portion of the mask layer 106 formed on the portion of the top and the sidewall surfaces of the fin structures 102 in the PMOS region II may serve as a silicide block layer.

In one embodiment, the first openings 201 may be formed by a process including the following steps. First, a first patterned layer 107 may be formed to cover the NMOS region I. The first patterned layer 107 may also cover a portion of the mask layer 106 formed in the PMOS region II and may expose a portion of the surface of the mask layer 106 formed on the two opposite sides of the second dummy gate structure 120. Then, a mask sidewall 116 may be formed on each side of the second dummy gate structure 120 by etching the mask layer 106 formed on the two sides of the second dummy gate structure 120 using the first patterned layer 107 as an etch mask. Further, a portion of the fin structure 102 formed in the PMOS region II may be removed by etching using the mask sidewall 116 as an etch mask to form the first openings 201.

In one embodiment, the portion of the fin structures 102 in the PMOS region II may be removed by an anisotropic etching process. The anisotropic etching process may be a reactive ion etching process. The process parameters adapted in the reactive ion etching process may include a reaction gas including $CF_4$, $SF_6$, and Ar, a flow rate of $CF_4$ in a range of approximately 50 sccm to 100 sccm, a flow rate of $SF_6$ in a range of approximately 10 sccm to 100 sccm, a flow rate of Ar in a range of approximately 100 sccm to 300 sccm, a source power in a range of 500 W to 1000 W, an offset power in a range of approximately 50 W to 250 W, a chamber pressure in a range of approximately 50 mTorr to 200 mTorr, and a chamber temperature in a range of approximately 20° C. to 90° C. In one embodiment, the depth of each first opening 201 may be in a range of approximately 10 nm to 40 nm.

Further, after forming the first openings 201, the first patterned layer 107 may be removed. In one embodiment, the first patterned layer 107 may be made of photoresist. Moreover, the first patterned layer 107 may be removed by a wet photoresist-removal process or by an ashing process.

Figure 6:
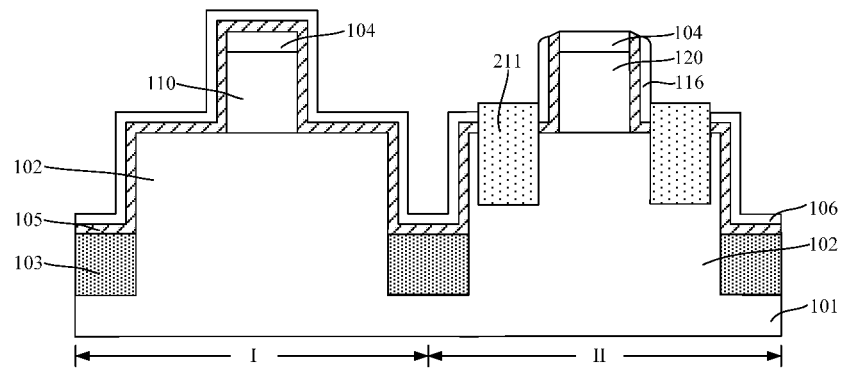

Further, returning to FIG. 17, a second doped source/drain region may be formed in the fin structure on each side of the dummy gate structure in the PMOS region (S1105). FIG. 6 shows a schematic cross-section view of a corresponding semiconductor structure.

Referring to FIG. 6, a second doped source/drain region 211 may be formed in the fin structure 102 in the PMOS region II on each side of the second dummy gate structure 120. The second doped source/drain regions 211 may be fabricated by a process including the following steps. A first stress layer (not shown) may be formed to fill up each first opening 201 (referring to FIG. 5). During the formation of the first stress layer, an in-situ ion implantation process may be simultaneously performed to form a second source/drain doped region 211 in the fin structure 102 in the PMOS region II next to each mask sidewall 116. Alternatively, after forming the first stress layer, an ion implantation process may then be performed on the first stress layer to form a second source/drain doped region 211 in the fin structure 102 in the PMOS region II next to each mask sidewall 116.

In one embodiment, the first stress layer may be made of SiGe, SiB, SiGeB, or any other appropriate material. The first stress layer may provide stress to the channel region in the PMOS region II and thus may improve the carrier mobility in the PMOS region II. In one embodiment, the first stress layer may be formed by a selective epitaxial process.

In one embodiment, the sidewall spacer on each side of the second dummy gate structure 120 may include an offset spacer 105 and a mask sidewall 116 formed on the side surface of the offset spacer 105. In other embodiments, the sidewall spacer on each side of the second dummy gate structure 120 may only include a mask sidewall.

Further, after forming the first stress layer, an oxygen treatment process may be performed on the top surface of the first stress layer so that an oxide layer may be formed on the surface of the first stress layer.

Figure 7:
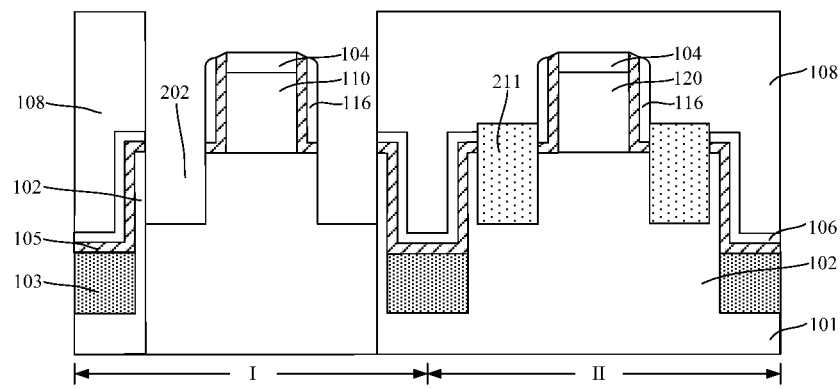

Further, returning to FIG. 17, two second openings may be formed in each fin structure in the NMOS region by removing a portion of the fin structure on each side of the dummy gate structure in the NMOS region (S1106). FIG. 7 shows a schematic cross-section view of a corresponding semiconductor structure.

Referring to FIG. 7, two second openings 202 may be formed in the fin structure 102 in the NMOS region I by removing a portion of the fin structure 102 on each side of the first dummy gate structure 110 in the NMOS region.

In one embodiment, prior to forming the second openings 202, the portion of the mask layer 106 formed in the NMOS region I may be etched to form a mask sidewall 116 to cover a sidewall surface of the corresponding offset spacer 105 in the NMOS region I. The thickness of the mask sidewall 116 may be in a range of approximately 3 nm to 6 nm.

After forming the second openings 202 by etching the fin structure 102, the mask layer 106 formed on a portion of the top and the sidewall surfaces of the fin structure 102 in the NMOS region I may be retained. The remaining portion of the mask layer 106 may prevent undesired epitaxial growth during a subsequent process to form a second stress layer. In addition, during a subsequent reactive annealing process, the remaining portion of the mask layer 106 formed on the portion of the top and the sidewall surfaces of the fin structure 102 in the NMOS region I may serve as a silicide block layer.

In one embodiment, the second openings 202 may be formed by a process including the following steps. First, a second patterned layer 108 may be formed to cover the PMOS region II. The second patterned layer 108 may also cover a portion of the mask layer 106 formed in the NMOS region I and may expose a portion of the surface of the mask layer 106 formed on the two opposite sides of the first dummy gate structure 110. Then, a mask sidewall 116 may be formed by on each side of the first dummy gate structure 110 by etching the mask layer 106 formed on the two sides of the first dummy gate structure 110 using the second patterned layer 108 as an etch mask. Further, a portion of the fin structure 102 formed in the NMOS region I may be removed by etching using the mask sidewall 116 as an etch mask to form the second openings 202.

In one embodiment, the portion of the fin structures 102 in the NMOS region I may be removed by an anisotropic etching process. The anisotropic etching process may be a reactive ion etching process. The process parameters adapted in the reactive ion etching process may include a reaction gas including $CF_4$, $SF_6$, and Ar, a flow rate of $CF_4$ in a range of approximately 50 sccm to 100 sccm, a flow rate of $SF_6$ in a range of approximately 10 sccm to 100 sccm, a flow rate of Ar in a range of approximately 100 sccm to 300 sccm, a source power in a range of 500 W to 1000 W, an offset power in a range of approximately 50 W to 250 W, a chamber pressure in a range of approximately 50 mTorr to 200 mTorr, and a chamber temperature in a range of approximately 20° C. to 90° C. In one embodiment, the depth of each second opening 202 may be in a range of approximately 10 nm to 40 nm.

Further, after forming the second openings 202, the second patterned layer 108 may be removed. In one embodiment, the second patterned layer 108 may be made of photoresist. Moreover, the second patterned layer 108 may be removed by a wet photoresist-removal process or by an ashing process.

Figure 8:
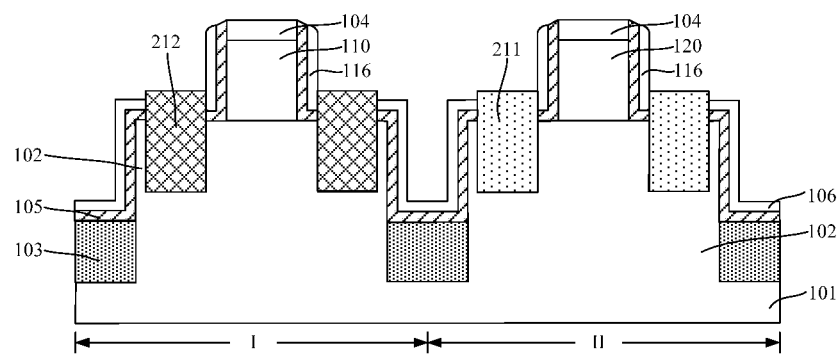

Further, returning to FIG. 17, first doped source/drain regions may be formed in the fin structure on the two opposite sides of the dummy gate structure in the NMOS region (S1107). FIG. 8 shows a schematic cross-section view of a corresponding semiconductor structure.

Referring to FIG. 8, a first doped source/drain region 212 may be formed in the fin structure 102 in the NMOS region I on each side of the first dummy gate structure 110. The first doped source/drain regions 212 may be fabricated by a process including the following steps. A second stress layer (not shown) may be formed to fill up the second openings 202 (referring to FIG. 7). During the formation of the second stress layer, an in-situ ion implantation process may be simultaneously performed to form a first source/drain doped region 212 in the fin structure 102 in the NMOS region I next to each mask sidewall 116. Alternatively, after forming the second stress layer, an ion implantation process may then be performed on the second stress layer to form a first source/drain doped region 212 in the fin structure 102 in the NMOS region I next to each mask sidewall 116.

In one embodiment, the second stress layer may be made of SiCP, SiC, SiP, or any other appropriate material. The second stress layer may provide stress to the channel region in the NMOS region I, and thus may improve the carrier mobility in the NMOS region I. In one embodiment, the second stress layer may be formed by a selective epitaxial process.

In one embodiment, the sidewall spacer on each side of the first dummy gate structure 110 may include an offset spacer 105 and a mask sidewall 116 formed on the side surface of the offset spacer 105. In other embodiments, the sidewall spacer on each side of the first dummy gate structure 110 may only include a mask sidewall.

Further, after forming the second stress layer, an oxygen treatment process may be performed on the top surface of the second stress layer so that an oxide layer may be formed on the surface of the second stress layer.

In one embodiment, the top surfaces of the first stress layer and the second stress layer may be oxidized through a same oxygen treatment process. In other embodiments, the top surfaces of the first stress layer and the second stress layer may be oxidized through different oxygen treatment processes.

Figure 9:
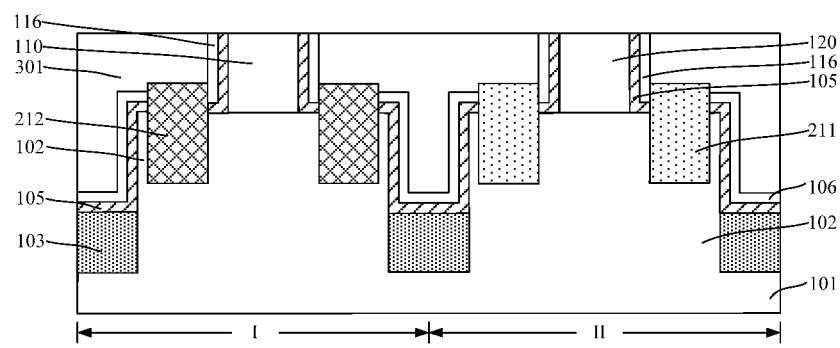

Further, returning to FIG. 17, a dummy dielectric layer may be formed in the first doped source/drain regions and the second doped source/drain regions and also on the sidewall surfaces of the dummy gate structures (S1108). FIG. 9 shows a schematic cross-section view of a corresponding semiconductor structure.

Referring to FIG. 9, a dummy dielectric layer 301 may be formed in the first doped source/drain regions 211 and the second doped source/drain regions 212 and also on the sidewall surfaces of the dummy gate structures. The dummy dielectric layer 301 may expose the top surfaces of the dummy gate structures.

In one embodiment, the dummy dielectric layer 301 may be formed on the first doped source/drain regions 211, the second doped source/drain regions 212, the mask sidewalls 116, the mask layer 106, the first dummy gate structures 110, and the second dummy gate structures 120.

In one embodiment, the dummy dielectric layer 301 may be made of a material different from the materials used to form the fin structures 102, the first dummy gate structures 110, the second dummy gate structures 120, the first stress layer, and the second stress layer. Moreover, in one embodiment, the dummy dielectric layer 301 may be made of $SiO_x$.

Further, the top surface of the dummy dielectric layer 301 may be leveled with the top surfaces of the first dummy gate structures 110 and the second dummy gate structures 120. Moreover, the dummy dielectric layer 301 may be formed by a process including the following steps. First, a dummy dielectric film may be formed on the first stress layer, the second stress layer, the mask sidewalls 116, the mask layer 106, and the hard mask layer 104 (referring to FIG. 8). The top surface of the dummy dielectric film may be higher than the top surfaces of the first dummy gate structures 110 and the second dummy gate structures 120. Then, a planarization process may be performed on the dummy dielectric film to remove the portion of the dummy dielectric film formed above the top surfaces of the first dummy gate structures 110 and the second dummy gate structures 120. Finally, after removing the hard mask layer 104, the dummy dielectric layer 301 with a top surface leveled with the top surfaces of the first dummy gate structures 110 and the second dummy gate structures 120 may be formed.

Figure 10:
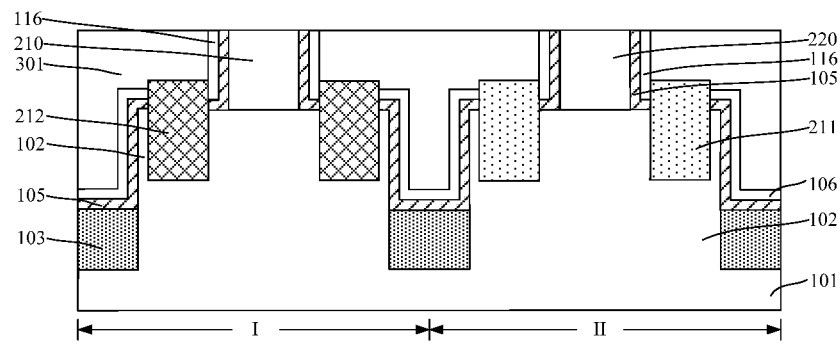

Further, returning to FIG. 17, each dummy gate structure may be removed to form a trench in the dummy dielectric layer, and then a gate structure may be formed in each trench (S1109). FIG. 10 shows a schematic cross-section view of a corresponding semiconductor structure.

Referring to FIG. 10, each first dummy gate structure 110 (referring to FIG. 9) and each second dummy gate structure 120 (referring to FIG. 9) may be removed to form a first trench and a second trench, respectively in the dummy dielectric layer 301. Then, a high-k dielectric layer may be formed on the sidewall and the bottom surfaces of the first trench and the second trench. Further, a gate electrode may be formed on the high-k dielectric layer in each of the first trench and the second trench.

Specifically, the first dummy gate structure 110 (referring to FIG. 9) may be removed by etching to form the first trench in the dummy dielectric layer 301 in the PMOS region I. In the meantime, the second dummy gate structure 120 (referring to FIG. 9) may also be removed by etching to form the second trench in the dummy dielectric layer in the NMOS region II.

Moreover, the high-k dielectric layer and the gate electrode formed in the first trench may together form a first gate structure 210. The first gate structure 210 may be situated on the isolation structure 103 in the PMOS region I. The first gate structure 210 may be formed across the fin structure 102 in the PMOS region I and may cover a portion of the top and the sidewall surfaces of the fin structure 102 in the PMOS region I. The high-k dielectric layer and the gate electrode formed in the second trench may together form a second gate structure 220. The second gate structure 220 may be situated on the isolation structure 103 in the NMOS region II. The second gate structure 220 may be formed across the fin structure 102 in the NMOS region II and may cover a portion of the top and the sidewall surfaces of the fin structure 102 in the NMOS region II.

Further, each side surface of the first gate structure 210 may be covered by a sidewall spacer and the sidewall may include an offset spacer 105 and a mask sidewall 116. Moreover, each side surface of the second gate structure 220 may be covered by a sidewall spacer and the sidewall may also include an offset spacer 105 and a mask sidewall 116.

The high-k dielectric layer is made of a high-k dielectric material. Specifically, the high-k dielectric material may refer to a material with a relative dielectric constant greater than the relative dielectric constant of $SiO_x$. For example, the high-k dielectric layer may be made of one or more of $HfO_2$, HfSiO, HfSiON, HfTaO, HfTiO, HfZrO, $ZrO_2$, $Al_2O_3$, etc. Moreover, the gate electrode layer may be made of a material including Cu, Al, W, etc.

In one embodiment, after forming the high-k dielectric layer but prior to forming the gate electrode, the fabrication process may also include performing a repair annealing process on the high-k dielectric layer. Specifically, the anneal temperature used in the repair annealing process may need to be higher than the anneal temperature used in a subsequently-performed reaction annealing process.

In one embodiment, the gate electrode is directly formed on the top of the corresponding high-k dielectric layer. In other embodiments, a work function layer may be formed between the high-k dielectric layer and the gate electrode. The work function layer may be used to adjust the threshold voltage of the subsequently-formed NMOS transistor or PMOS transistor.

Figure 11:
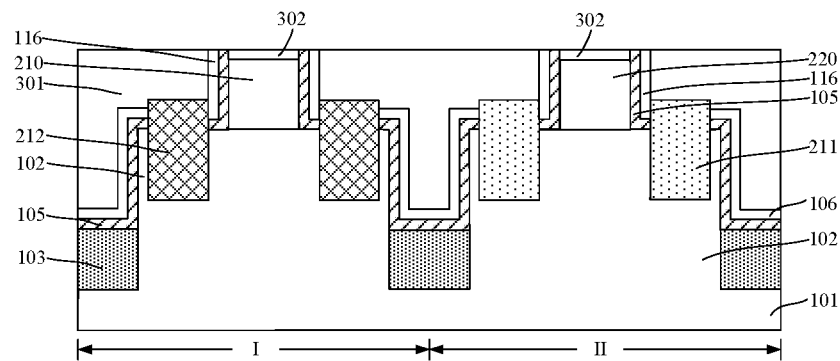

Further, returning to FIG. 17, a portion of the gate electrode in each gate structure may be removed and a cap layer may be formed on the remaining portion of the gate electrode (S1110). FIG. 11 shows a schematic cross-section view of a corresponding semiconductor structure.

Referring to FIG. 11, a portion of each gate electrode may be removed. Further, a cap layer 302 may be formed on the remaining portion of gate electrode.

In a subsequent process, a metal layer may be formed on the top surfaces of the first gate structures 210 and the second gate structures 220. Then, a reaction annealing process may be performed to remove the unreacted portion of the metal layer. Therefore, in order to avoid damages to the first gate structures 210 and the second gate structures 220 due to the removal of the unreacted metal layer, a cap layer 302 may be formed between the top of the first gate structure 210 and the metal layer and also between the top of the second gate structure 220 and the metal layer.

In one embodiment, the cap layers 302 may be formed by a process including the following steps. First, a portion of each gate electrode may be removed through a maskless etching process. Further, a cap film may be formed on the dummy dielectric layer 301 and the remaining portion of each gate electrode. The top surface of the cap film may be higher than the top surface of the dummy dielectric layer 301. The portion of the cap film formed above the top surface of the dummy dielectric layer 301 may be removed by polishing to form the cap layer 302.

The cap layer 302 may be made of a material different from the material of the dummy dielectric layer 301. In addition, the material used to form the cap layer 302 may not react with the subsequently-formed metal layer. Therefore, in one embodiment, the cap layer 302 is made of $SiN_x$. In other embodiments, the cap layer 302 may also be made of BN.

Further, the thickness of the cap layer 302 may not be too small or too large. When the thickness of the cap layer 302 is too small, the cap layer 302 may be easily removed during a subsequently-performed process to remove the dummy dielectric layer 301. However, when the thickness of the cap layer 302 is too large, an excessive amount of the gate electrode may be removed before forming the cap layer, and thus the electrical performance of the first gate structures 210 and the second gate structures 220 may be affected. In one embodiment, the thickness of the cap layer may be in a range of approximately 5 Å to 35 Å.

Figure 12:
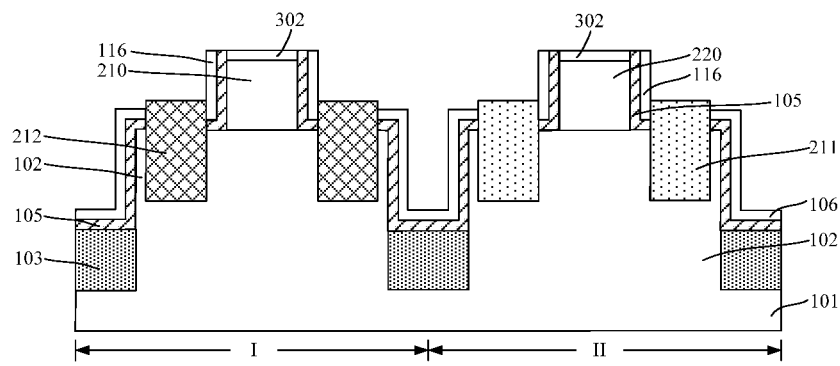

Further, returning to FIG. 17, the dummy dielectric layer may be removed to expose the surface of each first doped source/drain region and each second doped source/drain region (S1111). FIG. 12 shows a schematic cross-section view of a corresponding semiconductor structure.

Referring to FIG. 12, the dummy dielectric layer 301 (referring to FIG. 11) may be removed to expose the surfaces of the first doped source/drain regions 211 and the second doped source/drain regions 212.

In one embodiment, the dummy dielectric layer 301 may be removed by a wet etching process. Specifically, for a dummy dielectric layer 301 made of $SiO_x$, a HF solution may be used as the etch solution to remove the dummy dielectric layer 301.

Figure 13:
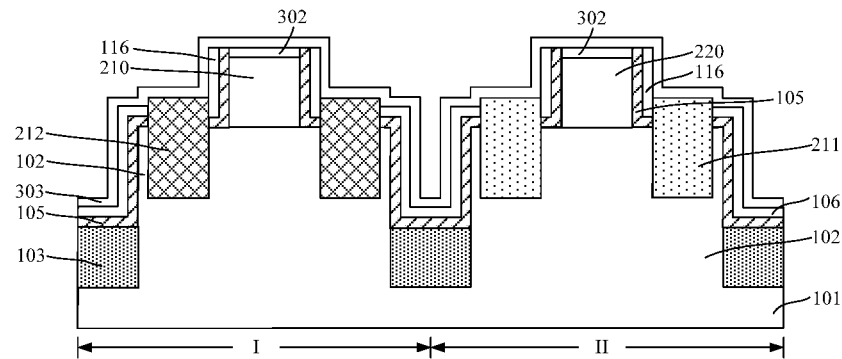

Further, returning to FIG. 17, a metal layer may be formed on the doped source/drain regions, the sidewall spacers, and the gate structures (S1112). FIG. 13 shows a schematic cross-section view of a corresponding semiconductor structure.

Referring to FIG. 13, a metal layer 303 may be formed on the first doped source/drain regions 212, the second doped source/drain regions 211, and the sidewall spacers as well as the top surfaces of the first gate structures 210 and the second gate structures 220.

In one embodiment, the metal layer 303 may also be formed on the mask layer 106. The mask layer 106 may serve as a silicide block layer during a subsequently-performed reaction annealing process. Moreover, during the process to form the metal layer 303, the portion of the metal layer 303 formed on the top of each gate structure may cover the corresponding cap layer 302.

The metal layer 303 may be made of a mono-metal or an alloy of Ni, W, Ti, Ta, Pt, Co, etc. The metal layer 303 may be formed by physical vapor deposition (PVD), metal sputtering, or atomic layer deposition (ALD).

The metal layer 303 may be used to provide metal atoms for forming a metal contact layer, e.g., a metal silicide layer, in a subsequent process. The material of the metal layer 303 may react with the material of the first doped source/drain regions and the second doped source/drain regions. Further, when the metal layer 303 is made of Ni, the consumed portion of the material of the first doped source/drain regions and the second doped source/drain regions may be small during a subsequently performed chemical reaction. Moreover, the line width of the formed metal contact layer may be small, and thus the process cost may be relatively low.

In one embodiment, the metal layer 303 may be made of Ni and may have a thickness in a range of approximately 50 Å to 200 Å.

In one embodiment, In order to prevent oxidation of the material used to form the metal layer 303 due to $O_2$ in the environment, after forming the metal layer 303, a protective layer may be formed on the surface of the meal layer 303. The protective layer may separate the metal layer 303 from $O_2$ in the environment. The protective layer may be made of Ti, Ta, TiN, TaN, or any other appropriate material.

Figure 14:
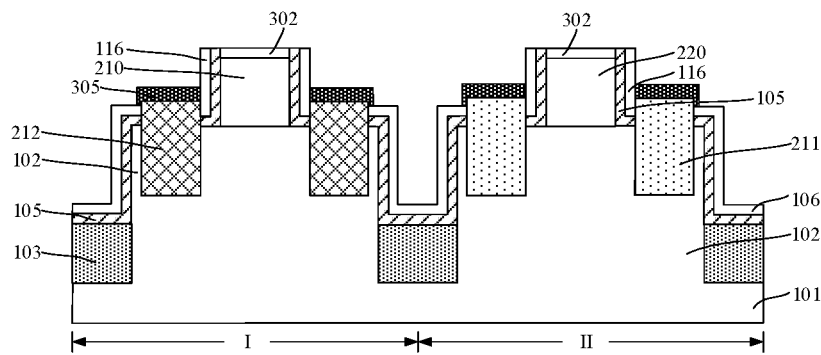

Further, returning to FIG. 17, a reaction annealing process may be performed to convert the portion of the metal layer formed on the doped source/drain regions into a metal contact layer through chemical reaction, and the unreacted portion of the metal layer may be removed after the reaction annealing process (S1113). FIG. 14 shows a schematic cross-section view of a corresponding semiconductor structure.

Referring to FIG. 14, a reaction annealing process may be performed on the metal layer 303 (referring to FIG. 13). During the reaction annealing process, the portion of the metal layer 303 formed on the first doped source/drain regions and the second doped source/drain regions may be converted to a metal contact layer 305 through chemical reaction. Further, after the reaction annealing process, the unreacted portion of the metal layer 303 may be removed. That is, the portion of the metal layer 303 formed on the top surfaces of the sidewall spacers, the first gate structures 210, the second gate structures 220, and the mask layer 106 may be removed.

The metal contact layer 305 may be used to reduce the contact resistance in the formed Fin-FET devices. In one embodiment, the metal layer 303 may be made of Ni and the fin structures 102 may be made of Si. Accordingly, the metal contact layer 305 may be made of $SiNi_x$. In other embodiments, the metal layer may be made of Ti, the fin structures may be made of Si, and accordingly, the metal contact layer may be made of $SiTi_x$.

In one embodiment, the metal layer 303 may cover the entire surface of each first doped source/drain region 212 as well as the entire surface of each second doped source/drain region 211. Therefore, after the reaction annealing process, the formed metal contact layer 305 may cover the entire surface of each first doped source/drain region 212 and the entire surface of each second doped source/drain region 211. Compared to conventional fabrication methods where the metal contact layer is only formed on a portion of the surface of each first doped source/drain region and a portion of the surface of each second doped source/drain region, the disclosed fabrication methods ensure the metal contact layer 305 cover the entire surface of each first doped source/drain region and the entire surface of each second doped source/drain region, and thus, after forming the metal contact layer 305, the contact resistance in the formed Fin-FET devices may be smaller so that the operation speed of the formed Fin-FET devices may be improved.

In the course of the reaction annealing process, the material of the metal layer 303 may react with the material of the first doped source/drain regions and the second doped source/drain regions. In one embodiment, the first doped source/drain regions and the second doped source/drain regions may include a large number of silicon atoms, and accordingly, the chemical reaction may be silicide reaction.

Further, during the reaction annealing process, the metal layer 303 may not react with the cap layer 302. In addition, the mask layer 106 formed on the sidewall surfaces of the fin structures 102 as well as a portion of the top surfaces of the fin structures 102 may serve as a silicide block layer to prevent chemical reaction between the fin structures 102 and the metal layer 303. As such, the metal contact layer may not be formed on the undesired region of the fin structures 102.

Moreover, laser annealing, spike annealing, or millisecond annealing may be performed during the reaction annealing process. In one embodiment, laser annealing is performed during the reaction annealing process. The anneal temperature used in the reaction annealing process may not be too low or too high. When the anneal temperature is too low during the reaction annealing process, the silicidation degree of the formed metal contact layer 305 may be low, and thus the resistivity of the metal contact layer 305 may be high. However, when the anneal temperature in the reaction annealing process is too high, the properties of the metal contact layer 305 may be changed at such a high temperature, and thus the quality of the formed metal contact layer 305 may be undesired.

In one embodiment, the reaction annealing process is a laser annealing process and the anneal temperature is in a range of approximately 800° C. to 880° C., such as 800° C., 850° C., and 880° C.

In one embodiment, after forming the first gate structures 210 and the second gate structures 220, the metal contact layer 305 may be formed. As such, undesired effects on the metal contact layer 305 due to the fabrication process for the first gate structures 210 and the second gate structures 220 may be avoided. In addition, after forming the high-k dielectric layers in both the first gate structures 210 and the second gate structures 220, a repair annealing process may be performed on the high-k dielectric layers. Moreover, the anneal temperature used in the repair annealing process may be higher than the anneal temperature used in the reaction annealing process. Therefore, the metal contact layer 305 may not be formed before forming the high-k dielectric layers; otherwise, the metal contact layer 305 may be damaged during the repair annealing process, resulting in degraded properties of the metal contact layer 305.

Further, after forming the metal contact layer 305, the unreacted portion of the metal layer 303 may be removed. Specifically, the process to remove the unreacted portion of the metal layer 303 may include removing the portion of the metal layer 303 covering the cap layers 302 and removing the portion of the metal layer 303 formed on the mask layer 106.

The unreacted portion of the metal layer 303 may be removed by a wet etching process. The wet etching process may use a mixture of sulfuric acid and hydrogen peroxide as an etch solution. Moreover, prior to removing the unreacted portion of the metal layer 303, the protective layer 304 may be removed. In one embodiment, the protective layer 304 may be removed by a wet etching process using a mixture of sulfuric acid and hydrogen peroxide as an etch solution.

During the process to remove the unreacted portion of the metal layer 303, because of the protection provided by the cap layer 302 formed on the top surface of each gate electrode, unexpected damages to the gate electrode layers due to the exposure of the gate electrode layers in the etching environment during the etching process to remove the metal layer 303 may be avoided.

Figure 15:
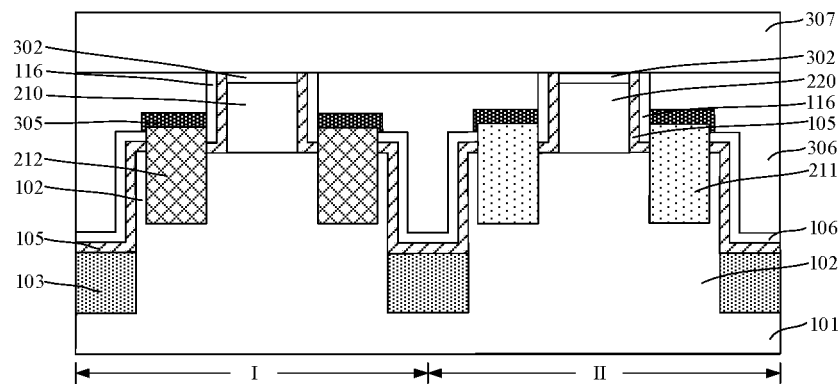

Further, returning to FIG. 17, a dielectric layer with a top surface higher than the top surfaces of the gate structures may be formed on the metal contact layer, the sidewall spacers, and the gate structures (S1114). FIG. 15 shows a schematic cross-section view of a corresponding semiconductor structure.

Referring to FIG. 15, a dielectric layer may be formed on the metal contact layer 305, the offset spacers 105, the mask sidewalls 116, the first gate structures 210, and the second gate structures 220. The top surface of the dielectric layer may be higher than the top surfaces of the first gate structures 210 and the second gate structures 220.

In one embodiment, In order to ensure desired properties of the dielectric layer and reduce the process time for forming the dielectric layer, the dielectric layer may include a first dielectric layer 306 and a second dielectric layer 307 formed on the first dielectric layer 306 with the density of the first dielectric layer 306 greater than the density of the second dielectric layer. Moreover, the process to form the dielectric layer may include forming the first dielectric layer 306 through a high-density plasma deposition process with the top surface of the first dielectric layer 306 leveled with the top surfaces of the first gate structures 210 and the second gate structures 220, and then forming a second dielectric layer 307 on the first dielectric layer 306 through a plasma-enhanced tetraethyl orthosilication (PETEOS) process.

In one embodiment, a cap layer 302 may be formed on the top surfaces of the first gate structures 210 and the second gate structures 220; accordingly, the top surface of the first dielectric layer 306 may be leveled with the top surface of the cap layer 302.

During the process to form the first dielectric layer 306, a portion of the first dielectric layer 306 may be formed higher than the top surfaces of the first gate structures 210 and the second gate structures 220. Therefore, the fabrication process may further include a chemical mechanical polishing (CMP) process to remove the portion of the first dielectric layer 306 formed above the top surfaces of the first gate structures 210 and the second gate structures 220. Further, because the density of the first dielectric layer 306 may be high, the first dielectric layer 306 may not be easily deformed during the CMP process, and thus the quality of the first dielectric layer 306 may be ensured. In the meantime, because the deposition rate during the PETEOS process may be large, the process time to form the second dielectric layer 307 may be short.

Further, returning to FIG. 17, a via may be formed through the dielectric layer to expose a portion of the metal contact layer 305 formed on each doped source/drain region, and then a conductive plug may be formed to fill the via (S1115). FIG. 16 shows a schematic cross-section view of a corresponding semiconductor structure.

Referring to FIG. 16, corresponding to each first doped source/drain region 212 or each second doped source/drain region 211, a via may be formed through the first dielectric layer 306 and the second dielectric layer 307 to expose a portion of the surface of the corresponding metal contact layer 305. Further, a conductive plug 308 may be formed to fill up each via. The conductive plug 308 may be electrical connected to the corresponding first doped source/drain region or second doped source/drain region through the metal contact layer 305.

In one embodiment, each via may expose a portion of the surface of the metal contact layer 305 such that the subsequently-formed conductive plug 308 may not be electrically connected to the first gate structures 210 or the second gate structures 220.

The process to form the vias in the dielectric layer may include the following steps. First, a patterned photoresist layer may be formed on the top of the dielectric layer. Then, the vias may be formed by etching the second dielectric layer 307 and the first dielectric layer 306 using the patterned photoresist layer as an etch mask until a portion of the surface of the metal contact layer 305 is exposed. Finally, the patterned photoresist layer may be removed.

The conductive plug 308 may be made of a material including Cu, Al, W, and any other appropriate material. In one embodiment, the conductive plug 308 is made of W. The process to form the conductive plugs 308 may include the following steps. First, a conductive film may be formed to fill up the vias. The conductive film may also be formed on the top surface of metal contact layer 305. Then, a planarization process may be performed on the conductive film to remove the portion of the conductive film formed on the top of the dielectric layer and thus form the conductive plugs 308. Moreover, the formed conductive plugs 308 may fill up the vias.

In one embodiment, the formed metal contact layer 305 may be situated on the entire surface of each first doped source/drain region 212 and also on the entire surface of the second doped source/drain region 211. Further, only a portion of the formed metal contact layer 305 may be in contact with the corresponding conductive plug 308. That is, the surface area of each metal contact layer 305 may be larger than the bottom surface of the corresponding conductive plug 308. Therefore, the contact resistance in the Fin-FET devices formed by the disclosed fabrication method may be small, leading to a higher operation speed of the formed Fin-FET devices.

In one embodiment, the gate structures, including the first gate structures 210 and the second gate structures 220, may be metal gate structures. For illustration purpose, the fabrication process is described to form doped source/drain regions before forming the gate structures. In other embodiments, when the gate structures are metal gate structures, the gate structures may also be formed before forming the doped source/drain regions.

In one embodiment, in order to protect the gate electrodes in the gate structures, a cap layer may be formed on the gate structures prior to forming the metal layer. Further, during the process to remove the unreacted portion of the metal layer, the portion of the metal layer formed on the cap layer may also be removed.

For example, when the gate electrodes are metal gate electrodes and the gate structures are formed after forming the doped source/drain regions, the process to form the Fin-FET devices may include providing a substrate and forming a plurality of fin structures on the substrate. The fin structures may bulge from the surface of the substrate. Further, an isolation structure covering a portion of the sidewall surfaces of the fin structures may also be formed on the substrate, and the top surface of the isolation structure may be lower than the top surfaces of the fin structures. Moreover, a plurality of gate structures may be formed on the isolation structure across the fin structures. The gate structures may be metal gate structures and the gate structures may cover a portion of the top and sidewall surfaces of each fin structure. Further, each sidewall of the gate structures may be covered by a sidewall spacer. In addition, two doped source/drain regions may be formed in the fin structure on the two opposite sides of each gate structure, and a cap layer may be formed on the top of the gate structure. In order to reduce the process complexity, the cap layer may be formed during the fabrication of the gate structures. A metal layer may then formed on the doped source/drain regions, the cap layer, and the sidewall spacers. A reaction annealing process may be performed to form a metal contact layer on the doped source/drain regions. After forming the metal contact layer, the unreacted portion of the metal layer may be removed. Finally, a dielectric layer and a plurality of conductive plugs may be formed.

In other embodiments, the gate electrodes in the gate structures may also be polycrystalline silicon gate electrodes. Moreover, the gate structures may be formed before forming the doped source/drain regions. In addition, during the reaction annealing process, the portion of the metal layer formed on the top surfaces of the gate structures may be converted into a metal contact layer through chemical reaction.

The present disclosure also provides a Fin-FET device corresponding to the fabrication methods described above. FIG. 16 shows a schematic cross-section view of an exemplary Fin-FET device consistent with various disclosed embodiments.

Referring to FIG. 16, the Fin-FET device may include a substrate 101 and a plurality of fin structures 102 formed on the substrate 101. The Fin-FET device may also include an isolation structure 103 formed on the substrate 101 and covering a portion of the sidewall surfaces of the fin structures 102. The top surface of the isolation structure 103 may be lower than the top surfaces of the fin structures 102.

The Fin-FET device may also include a plurality of gate structures formed on the isolation structure 103 across the fin structures 102. The gate structures 102 may cover a portion of the top and the sidewall surfaces of each fin structure 102. Further, the Fin-FET device may include a sidewall spacer on each sidewall surface of the gate structures 102.

The Fin-FET device may also include doped source/drain regions formed in the fin structures on the two opposite sides of each gate structure. Specifically, the entire surface of each doped source/drain region may be covered by a metal contact layer 305.

The Fin-FET device may further include a dielectric layer formed on the metal contact layer 305, the sidewall spacers, and the gate structures. The top surface of the dielectric layer may be higher than the top surfaces of the gate structures.

Moreover, the Fin-FET device may also include a conductive plug 308 formed in the dielectric layer to electrically connect to the metal contact layer 305 on each doped source/drain region.

In one embodiment, the plurality of conductive plugs 308 may be formed by a process including the following steps. First, a plurality of vias may be formed in the dielectric layer to expose a portion of the surface of each metal contact region. Then, a conductive material may be used to fill up the vias. The top surface of the deposited conductive material may be higher than the top surfaces of the fin structures. A planarization process may be performed to remove the portion of the conductive material formed on the top surfaces of the fin structures, and thus form the plurality of conductive plugs 308.

In one embodiment, the gate structures, the doped source/drain regions, and the dielectric layer may be formed by the fabrication methods described above.

According to the disclosed Fin-FET devices, the width of the vias formed before forming the conductive plugs 308 may be small so that each subsequently-formed conductive plug 308 may have a sufficient distance from the corresponding first gate structure 210 or from the corresponding second gate structure 220. Therefore, electrical connections between the conductive plug 308 and the first gate structure 210 and between the conductive plug 308 and the second gate structure 220 may be avoided.

Further, the metal contact layer 305 may be formed on the entire surface of the first doped source/drain regions 212 as well as the entire surface of the second doped source/drain regions 211. Therefore, the metal contact layer 305 may be able to reduce the contact resistance in the Fin-FET device such that the electrical performance of the formed Fin-FET device may be improved and the operation speed of the Fin-FET device may also be improved.

Compared to conventional Fin-FET devices and fabrication methods, the disclosed Fin-FET devices and fabrication methods in the present disclosure may demonstrate the following advantages.

According to the disclosed fabrication methods for Fin-FET devices, after forming the doped source/drain regions and the gate structures, a metal layer may be directly formed on top surfaces of the doped source/drain regions, the sidewall spacers, as well as the gate structures. Then, a reaction annealing process may be performed on the metal layer to convert the portion of the metal layer formed on the doped source/drain regions into a metal contact layer through chemical reaction. Therefore, according to the disclosed fabrication methods, the metal contact layer may be formed on the entire surface of the doped source/drain regions. Subsequently, a dielectric layer may be formed and, corresponding to each doped source/drain region, a via may then be formed through the dielectric layer to expose a portion of the surface of the metal contact layer formed on the doped source/drain region. Further, the plurality of vias may be filled with a conductive material to form a plurality of conductive plugs. Because the formed metal contact layer covers the entire surface of each doped source/drain region, the surface area of the metal contact layer may be large such that the metal contact layer may efficiently reduce the contact resistance in the formed Fin-FET device, and thus may improve the electrical performance of the formed Fin-FET device.

Further, when the gate structures are metal gate structures, prior to forming the metal layer, a portion of the gate electrode may be removed by etching and then a cap layer may be formed on the remaining portion of the gate electrode. Further, during the process to remove the unreacted portion of the metal layer, the cap layer may provide protection for the gate electrode so that etching damages to the gate electrode may be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor (Fin-FET) device, comprising:
    forming a plurality of fin structures on a substrate;
    forming an isolation structure on the substrate to cover a portion of sidewall surfaces of the fin structures;
    forming a plurality of gate structures across the fin structures and covering a portion of sidewall and top surfaces of the fin structures;
    forming doped source/drain regions in the fin structures on two opposite sides of each gate structure;
    forming a cap layer on the plurality of gate structures;
    forming a metal layer on top surfaces of the doped source/drain regions and the cap layer;
    performing a reaction annealing process on the metal layer to convert a portion of the metal layer formed on the doped source/drain regions into a metal contact layer, wherein the cap layer does not react with the metal layer during the reaction annealing process;
    removing an unreacted portion of the metal layer after the reaction annealing process;
    forming a dielectric layer on the metal contact layer and the gate structures, wherein a top surface of the dielectric layer is higher than the top surfaces of the gate structures;
    forming a plurality of vias through the dielectric layer to expose a portion of the metal contact layer; and
    forming a plurality of conductive plugs by filling up the vias.

2. The method for fabricating the Fin-FET device according to claim 1, wherein:
    the metal layer covers entire surfaces of the doped source/drain regions; and
    the metal layer is made of one or more of Ni, W, Ti, Ta, Pt, and Co.

3. The method for fabricating the Fin-FET device according to claim 1, wherein:
    the reaction annealing process performed to convert the metal layer into the metal contact layer is a laser annealing process; and
    an anneal temperature used in the laser annealing process is in a range of approximately 800° C. to 880° C.

4. The method for fabricating the Fin-FET device according to claim 1, wherein the metal layer is also formed above the isolation structure, and accordingly:
    after the reaction annealing process, a portion of the metal layer formed above the isolation structure and the gate structures is unreacted; and
    the unreacted portion of the metal layer formed above the isolation structure and the gate structures is removed by a wet etching process.

5. The method for fabricating the Fin-FET device according to claim 1, wherein:
    the gate structures are metal gate structures; and
    the gate structures are formed after forming the doped source/drain regions.

6. The method for fabricating the Fin-FET device according to claim 5, wherein forming the gate structures and the doped source/drain regions further includes:
    forming a plurality of dummy gate structures on the isolation structure across the fin structures with a sidewall spacer formed on sidewall surfaces of each dummy gate structures, wherein the dummy gate structures cover a portion of the sidewall and the top surfaces of the fin structures;
    forming the doped source/drain regions in the fin structures on two opposite sides of each dummy gate structure;
    forming a dummy dielectric layer on the doped source/drain regions and the sidewall surfaces of the dummy gate structures, wherein the dummy dielectric layer exposes top surfaces of the dummy gate structures;
    removing each dummy gate structure to form a trench in the dummy dielectric layer;
    forming a high-k dielectric layer on sidewall and bottom surfaces of each trench; and
    forming a gate electrode on the high-k dielectric layer to fill up each trench.

7. The method for fabricating the Fin-FET device according to claim 6, after forming the gate electrodes and prior to forming the metal layer, further including:
    removing a portion of each gate electrode;
    forming the cap layer on a remaining portion of each gate electrode, and removing the dummy dielectric layer to expose the surfaces of the doped source/drain regions, wherein
a thickness of the cap layer is in a range of approximately 5 Å to 35 Å; and
the cap layer is made of one of $SiN_x$ and BN.

8. The method for fabricating the Fin-FET device according to claim 7, wherein:
when forming the metal layer on each gate structure, a portion of the metal layer is formed on each cap layer; and
when removing the unreacted portion of the metal layer, the portion of the metal layer formed on each cap layer is removed.

9. The method for fabricating the Fin-FET device according to claim 6, after forming the high-k dielectric layer and prior to forming the gate electrodes, further including:
performing a repair annealing process on the high-k dielectric layer; and
an anneal temperature in the repair annealing process is higher than an anneal temperature of the reaction annealing process.

10. The method for fabricating the Fin-FET device according to claim 1, wherein:
the gate structures are metal gate structures and the doped source/drain regions are formed after forming the gate structures;
prior to forming the metal layer, the cap layer is formed on a top surface of each gate structure; and
removing the unreacted portion of the metal layer includes removing a portion of the metal layer formed on each cap layer.

11. The method for fabricating the Fin-FET device according to claim 1, wherein:
the gate structures are polycrystalline silicon gate structures and the doped source/drain regions are formed after forming the gate structures; and
the reaction annealing process converts a portion of the metal layer formed on the gate structures into a metal contact layer.

12. The method for fabricating the Fin-FET device according to claim 1, wherein:
prior to forming the metal layer on the top surfaces of the doped source/drain regions and the gate structures, a plurality of sidewall spacers covering sidewall surfaces of the gate structures are formed; and
the metal layer is also formed on the sidewall spacers.

13. The method for fabricating the Fin-FET device according to claim 1, wherein:
after forming the metal layer and prior to performing the reaction annealing process, a protective layer is formed on the metal layer; and
after performing the reaction annealing process, the protective layer is removed.

14. The method for fabricating the Fin-FET device according to claim 1, wherein the Fin-FET device includes a plurality of N-type metal-oxide-semiconductor (NMOS) transistors, P-type metal-oxide-semiconductor (PMOS) transistors, and complementary metal-oxide-semiconductor (CMOS) transistors.

15. The method for fabricating the Fin-FET device according to claim 1, wherein:
the dielectric layer includes a first dielectric layer and a second dielectric layer formed on the second dielectric layer;
a density of the first dielectric layer is larger than a density of the second dielectric layer; and
forming the first dielectric layer and the second dielectric layer includes:
forming the first dielectric layer with a top surface leveled with the top surfaces of the gate structures through a high-density plasma deposition process;
forming the second dielectric layer on the first dielectric layer through a plasma-enhanced tetraethyl orthosilication (PETEOS) process.

16. The method for fabricating the Fin-FET device according to claim 1, wherein forming the doped source/drain regions includes:
forming an opening in the fin structures next to each sidewall spacer; and
forming a stress layer to fill up each opening, wherein:
the doped source/drain regions are formed by an in-situ ion implantation process performed during forming the stress layer or by an ion implantation process performed on the stress layer after forming the stress layer.

17. The method for fabricating the Fin-FET device according to claim 1, wherein the metal layer is formed directly on top surfaces of the doped source/drain regions.

18. The method for fabricating the Fin-FET device according to claim 1, wherein the metal contact layer is formed on at least a portion of side surfaces of the doped source/drain regions.

19. The method for fabricating the Fin-FET device according to claim 1, wherein a thickness of the metal layer is in a range of approximately 50 Å to 200 Å.

20. A method for fabricating a fin field-effect transistor (Fin-FET) device, comprising:
forming a plurality of fin structures on a substrate;
forming an isolation structure on the substrate to cover a portion of sidewall surfaces of the fin structures;
forming a plurality of gate structures on the isolation layer across the fin structures and covering a portion of sidewall and top surfaces of the fin structures;
forming doped source/drain regions in the fin structures on two opposite sides of each gate structure, wherein forming the doped source/drain regions includes:
forming an opening in the fin structures next to each sidewall spacer; and
forming a stress layer to fill up each opening, wherein:
the doped source/drain regions are formed by an in-situ ion implantation process performed during forming the stress layer or by an ion implantation process performed on the stress layer after forming the stress layer; and
prior to forming the stress layer, a mask layer is formed on the top and the sidewall surfaces of the fin structures;
forming a metal layer on top surfaces of the doped source/drain regions and the gate structures;
performing a reaction annealing process on the metal layer to convert a portion of the metal layer formed on the doped source/drain regions into a metal contact layer, wherein during the reaction annealing process, the mask layer formed on the top and the sidewall surfaces of the fin structures serves as a silicide block layer;
removing an unreacted portion of the metal layer after the reaction annealing process;
forming a dielectric layer on the metal contact layer and the gate structures, wherein a top surface of the dielectric layer is higher than the top surfaces of the gate structures;

forming a plurality of vias through the dielectric layer to expose a portion of the metal contact layer; and
forming a plurality of conductive plugs by filling up the vias.

* * * * *